United States Patent
Wang

(10) Patent No.: US 6,544,878 B2
(45) Date of Patent: Apr. 8, 2003

(54) MICROELECTRONIC FABRICATION HAVING FORMED THEREIN TERMINAL ELECTRODE STRUCTURE PROVIDING ENHANCED BARRIER PROPERTIES

(75) Inventor: Tsing-Chow Wang, Cupertino, CA (US)

(73) Assignee: Aptos Corporation, Milpitas, CA (US)

( * ) Notice: Subject to any disclaimer, the term of this patent is extended or adjusted under 35 U.S.C. 154(b) by 0 days.

(21) Appl. No.: 09/970,231

(22) Filed: Oct. 3, 2001

(65) Prior Publication Data

US 2003/0049924 A1 Mar. 13, 2003

Related U.S. Application Data

(62) Division of application No. 09/564,589, filed on May 5, 2000, now Pat. No. 6,316,831.

(51) Int. Cl.[7] .................................. H01L 21/44
(52) U.S. Cl. .................. 438/612; 438/614; 438/653; 438/656
(58) Field of Search .................. 438/612, 614, 438/653, 656

(56) References Cited

U.S. PATENT DOCUMENTS

| | | | |
|---|---|---|---|
| 3,663,184 A | 5/1972 | Wood et al. | 257/738 |
| 4,514,751 A | 4/1985 | Bhattacharya | 257/764 |
| 4,927,505 A | 5/1990 | Sharma et al. | 204/34.5 |
| 5,130,779 A | 7/1992 | Agarwala et al. | 257/737 |
| 5,173,449 A | 12/1992 | Lorenzen et al. | 257/758 |
| 5,406,122 A | 4/1995 | Wong et al. | 257/753 |
| 5,656,858 A | 8/1997 | Kondo et al. | 257/737 |
| 5,665,639 A | * 9/1997 | Seppala et al. | 438/15 |
| 5,682,062 A | 10/1997 | Gaul | 257/723 |
| 5,821,620 A | 10/1998 | Hong | 257/751 |
| 5,920,794 A | 7/1999 | Hong | 438/643 |

* cited by examiner

Primary Examiner—T. N. Quach
(74) Attorney, Agent, or Firm—Tung & Associates

(57) ABSTRACT

Within both a method for fabricating a microelectronic fabrication, and the microelectronic fabrication fabricated employing the method, there is first provided a substrate. Within the method, there is then formed over the substrate a patterned bond pad layer. There is then formed over the patterned bond pad layer a barrier layer comprising: (1) a first titanium-tungsten alloy layer; (2) a titanium-tungsten alloy nitride layer formed upon the first titanium-tungsten alloy layer; and (3) a second titanium-tungsten alloy layer formed upon the titanium-tungsten alloy nitride layer. Finally, there is then formed upon the barrier layer a seed layer which comprises a titanium layer formed upon the barrier layer. The method contemplates a microelectronic fabrication fabricated employing the method. The barrier layer provides enhanced barrier properties within the microelectronic fabrication within which is formed the barrier layer.

12 Claims, 2 Drawing Sheets

US 6,544,878 B2

MICROELECTRONIC FABRICATION HAVING FORMED THEREIN TERMINAL ELECTRODE STRUCTURE PROVIDING ENHANCED BARRIER PROPERTIES

CROSS-REFERENCE TO RELATED APPLICATIONS

This is a divisional of application Ser. No. 09/564,589 filed on May 5, 2000, U.S. Pat. No. 6,316,831.

This application is related to: (1) co-assigned application Ser. No. 09/565,962 U.S. Pat. No. 6,448,171 titled "Microelectronic Fabrication Having Formed Therein Terminal Electrode Structure Providing Enhanced Passivation and Enhanced Bondability"; and (2) co-assigned application Ser. No. 09/565,541 U.S. Pat. No. 6,362,087 titled "Method for Fabricating a Microelectronic Fabrication Having Formed Therein a Redistribution Structure," each of which related co-assigned applications is filed on an even date herewith and the teachings of each of which related co-assigned applications is incorporated herein fully by reference.

BACKGROUND OF THE INVENTION

1. Field of the Invention

The present invention relates generally to microelectronic fabrications having formed therein terminal electrode structures. More particularly, the present invention relates to microelectronic fabrications having formed therein terminal electrode structures which provide enhanced barrier properties.

2. Description of the Related Art

Microelectronic fabrications are formed from microelectronic substrates over which are formed patterned microelectronic conductor layers which are separated by microelectronic dielectric layers.

In conjunction with various means and configurations for interconnecting microelectronic fabrications of various varieties, it is common in the art of microelectronic fabrication to employ integral to individual microelectronic fabrications terminal electrode structures at locations within the individual microelectronic fabrications where the individual microelectronic fabrications are to be interconnected. Such terminal electrode structures are typically formed integral to the individual microelectronic fabrications while employing various metallurgy layers, which under certain circumstances may include solder interconnection layers, to which the various means and configurations for interconnecting the microelectronic fabrications may be connected.

While terminal electrode structures are thus desirable and clearly essential within the art of microelectronic fabrication for effectively providing electrical interconnections for various varieties of microelectronic fabrications which may be fabricated within the art of microelectronic fabrication, terminal electrode structures are nonetheless not entirely without problems in the art of microelectronic fabrication when fabricating microelectronic fabrications. In that regard, it is typically highly desirable within the art of microelectronic fabrication, but nonetheless not always readily achievable within the art of microelectronic fabrication, to provide within a microelectronic fabrication a terminal electrode structure which provides enhanced barrier properties within the microelectronic fabrication within which is formed the terminal electrode structure.

It is thus towards the goal of providing for use when fabricating a microelectronic fabrication a terminal electrode structure which provides enhanced barrier properties within the microelectronic fabrication within which is formed the terminal electrode structure that the present invention is directed.

Various configurations and materials have been disclosed within the art of microelectronic fabrication for fabricating, with desirable properties, electrode structures within microelectronic fabrications.

For example, Agarwala et al., in U.S. Pat. No. 5,130,779, disclose: (1) a multi-layer solder layer terminal electrode structure with an enhanced aspect ratio for use within a microelectronic fabrication for directly interconnecting, with attenuated physical stress and strain, a pair of microelectronic substrates within the microelectronic fabrication; and (2) a method for forming the multi-layer solder layer terminal electrode structure with the enhanced aspect ratio for use within the microelectronic fabrication for directly interconnecting, with attenuated physical stress and strain, the pair of microelectronic substrates within the microelectronic fabrication. To realize the foregoing objects, the method for forming the multi-layer solder layer terminal electrode structure employs forming upon at least one terminal electrode solder layer employed within the multi-layer solder layer terminal electrode structure, prior to thermal reflow of the at least one terminal electrode solder layer: (1) a capping or encapsulant metal layer, or in the alternative; (2) a sidewall spacer layer, such that upon thermal reflow of the at least one terminal electrode solder layer the at least one terminal electrode solder layer is not susceptible to thermal reflow induced collapse.

In addition, Gaul, in U.S. Pat. No. 5,682,062, discloses a microelectronic fabrication system for interconnecting, with high a real density, integrated circuit die which are employed for fabricating the microelectronic fabrication system. To effect the foregoing result, the integrated circuit die employed within the microelectronic fabrication system may be fabricated in a fashion such that there is formed within the integrated circuit die a via an end portion of which is fashioned in the shape of either a prong or a receptacle, such that the integrated circuit die may be stacked to provide the microelectronic fabrication having fabricated therein the integrated circuit die with high a real density.

Finally, Hong, in U.S. Pat. No. 5,920,794, discloses an electrode structure which may be employed for making contact to a silicon semiconductor substrate within a semiconductor integrated circuit microelectronic fabrication while providing enhanced electromigration resistance within the semiconductor integrated circuit microelectronic fabrication within which is formed the electrode structure. The electrode structure which provides the enhanced electromigration resistance within the semiconductor integrated circuit microelectronic fabrication within which is formed the electrode structure comprises a multi-layer stack which in turn comprises, in the alterative: (1) a PtSi/TiW/TiW(N)/Au multi-layer stack; or (2) a PtSi/TiW/TiW(N)/TiW/Au multi-layer stack.

Desirable for use when fabricating microelectronic fabrications are additional terminal electrode structures which provide enhanced barrier properties within a microelectronic fabrication within which is formed the terminal electrode structure.

It is towards the foregoing object that the present invention is directed.

SUMMARY OF THE INVENTION

A first object of the present invention is to provide a terminal electrode structure for use within a microelectronic fabrication, and a method for fabricating the terminal electrode structure for use within the microelectronic fabrication.

A second object of the present invention is to provide the terminal electrode structure and the method for fabricating the terminal electrode structure in accord with the first object of the present invention, wherein the terminal electrode structure provides enhanced barrier properties within the microelectronic fabrication within which is formed the terminal electrode structure.

A third object of the present invention is to provide the method for forming the terminal electrode structure in accord with the first object of the invention and the second object of the invention, which method is readily commercially implemented.

In accord with the objects of the present invention, there is provided by the present invention a terminal electrode structure for use when fabricating a microelectronic fabrication, and a method for fabricating the terminal electrode structure for use when fabricating the microelectronic fabrication. To practice the method of the present invention, there is first provided a substrate. There is then formed over the substrate a patterned bond pad layer. There is then formed over the patterned bond pad layer a barrier layer comprising: (1) a first titanium-tungsten alloy layer; (2) a titanium-tungsten alloy nitride layer formed upon the first titanium-tungsten alloy layer; and (3) a second titanium-tungsten alloy layer formed upon the titanium-tungsten alloy nitride layer.

The method for fabricating the terminal electrode structure in accord with the present invention contemplates the terminal electrode structure fabricated in accord with the method for fabricating the terminal electrode structure in accord with the present invention.

The present invention provides a terminal electrode structure for use when fabricating a microelectronic fabrication, and a method for fabricating the terminal electrode structure for use when fabricating the microelectronic fabrication, wherein the terminal electrode structure provides enhanced passivation of the microelectronic fabrication within which is formed the terminal electrode structure. The present invention realizes the foregoing objects by employing when fabricating a terminal electrode structure within the microelectronic fabrication in accord with the present invention, and formed over a patterned bond pad layer in turn formed over a substrate employed within the microelectronic, fabrication, a barrier layer comprising: (1) a first titanium-tungsten alloy layer; (2) a titanium-tungsten alloy nitride layer formed upon the first titanium-tungsten layer; and (3) a second titanium-tungsten alloy layer formed upon the titanium-tungsten alloy nitride layer.

The method of the present invention is readily commercially implemented. As is illustrated within the context of the Description of the Preferred Embodiments which follows, the present invention employs methods and materials as are otherwise generally known in the art of microelectronic fabrication, but employed within the context of specific process controls and materials selections to provide the present invention. Since it is a materials selection and process control which thus provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a terminal electrode structure for use when fabricating a microelectronic fabrication, and a method for fabricating the terminal electrode structure for use when fabricating the microelectronic fabrication, wherein the terminal electrode structure provides enhanced barrier properties within the microelectronic fabrication within which is formed the terminal electrode structure. The present invention realizes the foregoing objects by employing when fabricating a terminal electrode structure within a microelectronic fabrication in accord with the present invention, formed over a patterned bond pad layer in turn formed over a substrate employed within the microelectronic fabrication, a barrier layer comprising: (1) a first titanium-tungsten alloy layer; (2) a titanium-tungsten alloy nitride layer formed upon the first titanium-tungsten layer; and (3) a second titanium-tungsten alloy layer formed upon the titanium-tungsten alloy nitride layer.

Although the present invention provides particular value when forming a terminal electrode structure for use when fabricating a semiconductor integrated circuit microelectronic fabrication, the present invention may be employed for forming terminal electrode structures for use when fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
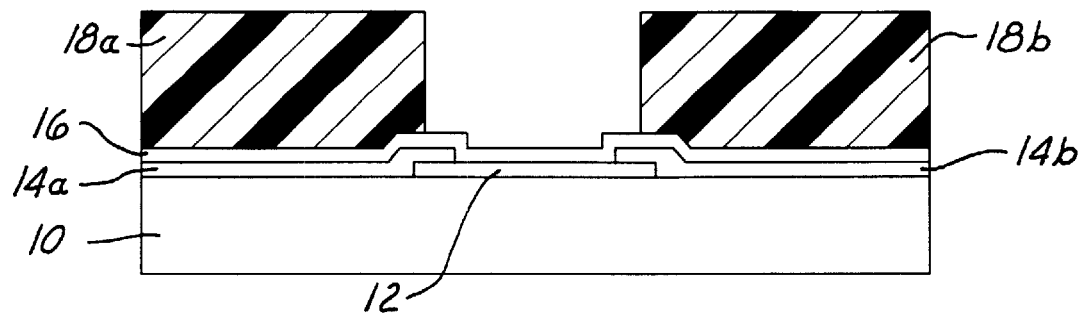
FIG. 1, FIG. 2, FIG. 3, FIG. 4 and FIG. 5 show a series of schematic cross-sectional diagrams illustrating the results of forming, in accord with a pair of preferred embodiments of the present invention, a pair of microelectronic fabrications fabricated in accord with the present invention.

Referring now to FIG. 1 to FIG. 4, there is shown a series of schematic cross-sectional diagrams illustrating the results of forming, in accord with a pair of preferred embodiments of the present invention, a pair of microelectronic fabrications fabricated in accord with the present invention. Shown in FIG. 1 is a schematic cross-sectional diagram of a microelectronic fabrication from which may be derived the pair of microelectronic fabrications in accord with the pair of preferred embodiments of the present invention.

Shown in FIG. 1, in a first instance, is a substrate 10 having formed thereover a patterned bond pad layer 12.

Within the preferred embodiment of the present invention with respect to the substrate 10, and although, as noted above, the present invention provides particular value when employed in fabricating a terminal electrode structure within a semiconductor integrated circuit microelectronic fabrication, the substrate 10 may be employed when fabricating a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, although not specifically illustrated within the schematic cross-sectional diagram of FIG. 1, the substrate 10 may consist of the substrate alone as employed within the microelectronic fabrication within which is employed the substrate, or in the alternative, the substrate 10 may comprise the substrate as employed within the microelectronic fabrication, where the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed of microelectronic materials including but not limited to microelectronic conductor materials, microelectronic semiconductor materials and microelectronic dielectric materials.

Similarly, and although also not specifically illustrated within the schematic cross-sectional diagram of FIG. 1, the substrate 10, typically and preferably, although not exclusively, when the substrate 10 comprises a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to, resistors, transistors, diodes and capacitors.

Most typically and preferably, within the preferred embodiment of the present invention, the substrate 10 comprises a semiconductor substrate having formed therein and/or thereupon various microelectronic devices, wherein the semiconductor. substrate also has formed thereupon and/or thereover several microelectronic layers which include but are not limited to the patterned bond pad layer 12.

Within the preferred embodiment of the present invention with respect to the patterned bond pad layer 12, the patterned bond pad layer 12 may be formed of bond pad materials as are conventional within the microelectronic fabrication within which is employed the patterned bond pad layer 12, such bond pad materials being selected from the group including but not limited to aluminum, aluminum alloy, copper and copper alloy bond pad materials. Typically and preferably, the patterned bond pad layer 12 may be formed from any of the foregoing bond pad materials, formed to a thickness of from about 6000 to about 12000 angstroms while being patterned to form the patterned bond pad layer 12 of bidirectional linewidth from about 40 to about 120 microns.

Shown also within the schematic cross-sectional diagram of FIG. 1, and also formed over the substrate 10 and passivating a pair of edges of the patterned bond pad layer 12 is a pair of patterned dielectric passivation layers 14a and 14b, where each of the pair of patterned dielectric passivation layers 14a and 14b has formed therein a protrusion within each of the pair of patterned dielectric passivation layers 14a and 14b at a location where each of the pair of patterned dielectric passivation layers 14a and 14b passivates a corresponding edge of the patterned bond pad layer 12, and while similarly each of the pair of patterned dielectric passivation layers 14a and 14b does not cover a central portion of the patterned bond pad layer 12. While the schematic cross-sectional diagram of FIG. 1 illustrates this feature of the pair of patterned dielectric passivation layers 14a and 14b incident to a cross-section through the microelectronic fabrication as illustrated within the schematic diagram of FIG. 1, it is nonetheless understood by a person skilled in the art that the pair of patterned dielectric passivation layers 14a and 14b is intended as illustrative of portions of a single patterned passivation dielectric layer which uniformly passivates all of the edges of the patterned bond pad layer 12 while leaving exposed the central portion of the patterned bond pad layer 12.

Within the preferred embodiment of the present invention, the pair of patterned dielectric passivation layers 14a and 14b may be formed of passivation dielectric materials as are conventional in the art of microelectronic fabrication, such passivation dielectric materials being selected from the group including but not limited to silicon oxide passivation dielectric materials, silicon nitride passivation dielectric materials, silicon oxynitride passivation dielectric materials, laminates thereof and composites thereof. Typically and preferably, the pair of patterned dielectric passivation layers 14a and 14b is formed at least in part of a silicon nitride dielectric passivation material, formed to a thickness of from about 8000 to about 12000 angstroms passivating the pair of opposite edges of the patterned bond pad layer 12 while leaving exposed the central portion of the patterned bond pad layer 12. Typically and preferably, each of the pair of patterned dielectric passivation layers 14a and 14b overlaps the patterned bond pad layer 12 by a distance of from about 6 to about 16 microns in order to provide optimal passivation of the edges of the patterned bond pad layer 12.

Shown also within the schematic cross-sectional diagram of FIG. 1 is a blanket barrier layer 16 formed upon the pair of patterned dielectric passivation layers 14a and 14b and extending over and upon the exposed central portion of the patterned bond pad layer 12.

Within the preferred embodiment of the present invention with respect to the blanket barrier layer 16, the blanket barrier layer 16 is typically and preferably formed of a barrier material which provides for inhibited interdiffusion and electromigration of each of: (1) the bond pad material from which is formed the patterned bond pad layer 12; and (2) the dielectric passivation material from which is formed the pair of patterned dielectric passivation layers 14a and 14b; with (3) a terminal electrode material which is employed for forming a terminal electrode layer which is subsequently formed contacting the blanket barrier layer 16. Similarly, the barrier material from which is formed the blanket barrier layer 16 also inhibits with respect to the patterned bond pad layer 12 diffusion of: (1) an encapsulation or polymer material which is not shown within the schematic cross-sectional diagram of FIG. 1, but subsequently employed in further assembly of the microelectronic fabrication whose schematic cross-sectional diagram is illustrated in FIG. 1; and (2) an ambient environment, including ambient moisture within the ambient environment.

Although such barrier materials may in general include but are not limited to various refractory metal barrier materials (i.e., titanium, tungsten and molybdenum refractory metal barrier materials) and alloys thereof, for the present invention and the preferred embodiments of the present invention, it has been determined that the blanket barrier layer 16 provides particularly propitious barrier properties within the microelectronic fabrication within which is formed the blanket barrier layer 16 when the blanket barrier layer 16 is formed of a stack of layers comprising: (1) a blanket first titanium-tungsten alloy layer of thickness about 450 to about 550 angstroms, having formed thereupon; (2) a blanket titanium-tungsten alloy nitride layer of thickness about 2700 to about 3300 angstroms, in turn having formed thereupon; (3) a blanket second titanium-tungsten alloy layer of thickness about 900 to about 1100 angstroms. Each of the foregoing three layers which are employed for forming the blanket barrier layer 16 may be formed employing methods as are conventional in the art of microelectronic fabrication, including but not limited to a chemical vapor deposition (CVD) methods, thermally assisted evaporation methods, physical vapor deposition (PVD) sputtering methods and thermal nitridation methods. As is illustrated within the schematic cross-sectional diagram of FIG. 1, the blanket barrier layer 16 is formed over and upon (i.e., contacting) the patterned bond pad layer 12, and although not specifically illustrated within the schematic cross-sectional diagram of FIG. 1 the blanket barrier layer 16 typically and preferably does not comprise a silicide layer contacting the patterned bond pad layer 16.

Within the present invention and the preferred embodiment of the present invention, each of the blanket first titanium-tungsten alloy layer and the blanket second titanium-tungsten alloy layer typically and preferably has a titanium:tungsten atomic ratio of from about 27:73 to about 33:67. Similarly, within the present invention and the preferred embodiment of the present invention the blanket titanium-tungsten alloy nitride layer typically and preferably has a titanium:tungsten:nitrogen atomic ratio of from about 10:60:22 to about 12:62:25.

Similarly, although not specifically illustrated within the schematic cross-sectional diagram of FIG. 1, within the context of each of the two preferred embodiments of the present invention the blanket barrier layer 16 typically and preferably also has formed thereupon a blanket seed layer (typically and preferably formed employing a sputtering method), typically and preferably formed of a seed material appropriate to a conductor material from which is formed a plated terminal electrode layer which is subsequently formed over the blanket barrier layer 16. Within a first preferred embodiment of the present invention, the blanket seed layer 16 is typically and preferably formed of a gold or gold alloy seed material, formed upon the blanket barrier layer to a thickness of from about 900 to about 11100 angstroms. Within a second preferred embodiment of the present invention, the blanket seed layer is typically and preferably formed of a laminate of: (1) a blanket titanium layer formed to a thickness of from about 900 to about 1100 angstroms formed upon the blanket barrier layer 16; and (2) a blanket copper layer formed to a thickness of from about 3600 to about 4400 angstroms formed upon the blanket titanium layer. Within both the first preferred embodiment of the present invention and the second preferred embodiment of the present invention, the blanket seed layer provides for enhanced plating characteristics with respect to an electroplating method employed in further fabrication of the terminal electrode layer within the microelectronic fabrication whose schematic cross-sectional diagram is illustrated in FIG. 1.

Figure 5:
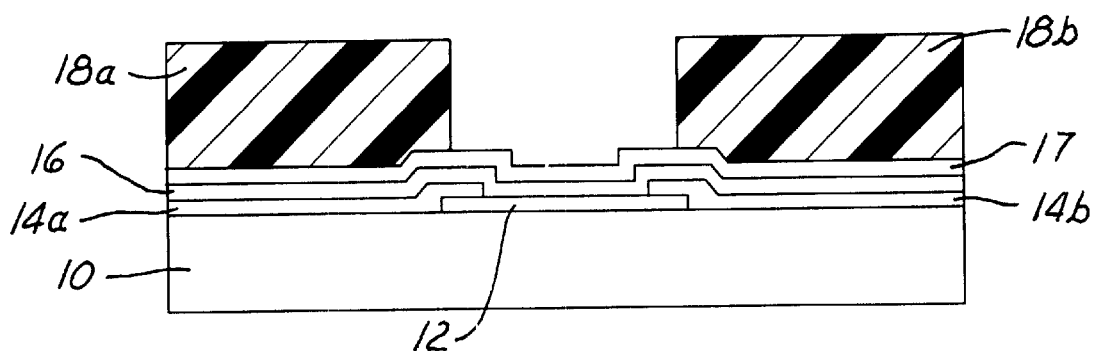

For reference purposes, a schematic cross-sectional diagram of a microelectronic fabrication having formed therein a blanket seed layer in accord with foregoing description is provided within FIG. 5. All layers and structures within the microelectronic fabrication whose schematic cross-sectional diagram is illustrated in FIG. 5 correspond with layers and structures within the microelectronic fabrication whose schematic cross-sectional diagram is illustrated in FIG. 1, with the exception of the addition of a blanket seed layer 17 formed upon the blanket barrier layer 16. Similarly, within the schematic cross-sectional diagram of FIG. 5, the blanket seed layer 17, rather than the blanket barrier layer 16, thus has formed thereupon the pair of patterned photoresist layers 18a and 18b.

Finally, there is also shown within the schematic cross-sectional diagram of FIG. 1 a pair of patterned photoresist layers 18a and 18b formed over and upon the blanket barrier layer 16 which within the context of the preferred embodiments of the present invention has formed thereupon the blanket seed layer which is not specifically illustrated within the schematic cross-sectional diagram of FIG. 1.

Within the preferred embodiment of the present invention with respect to the pair of patterned photoresist layers 18a and 18b, the pair of patterned photoresist layers 18a and 18b may be formed employing methods and photoresist materials as are conventional in the art of microelectronic fabrication, such photoresist materials being selected from the general groups of photoresist materials including but not limited to positive photoresist materials and negative photoresist materials. Typically and preferably, within the first preferred embodiment of the present invention, each of the pair of patterned photoresist layers 18a and 18b is formed to a thickness of from about 25 to about 35 microns to define an aperture of bidirectional aperture width from about 30 to about 114 microns. Within the first preferred embodiment of the present invention, the aperture of bidirectional aperture width of from about 30 to about 114 microns is sized such that there is provided enhanced and optimized passivation over the pair of patterned dielectric passivation layers 14a and 14b of the patterned terminal electrode layer subsequently formed into the aperture of the bidirectional aperture width of from about 30 to about 114 microns. Typically and preferably, within the second preferred embodiment of the present invention, each of the pair of patterned photoresist layers 18a and 18b is formed to a thickness of from about 56 to about 64 microns to define an aperture of bidirectional aperture width of from about 44 to about 128 microns, which provides similar passivation properties as noted above with respect to the first preferred embodiment of the present invention.

Figure 2:
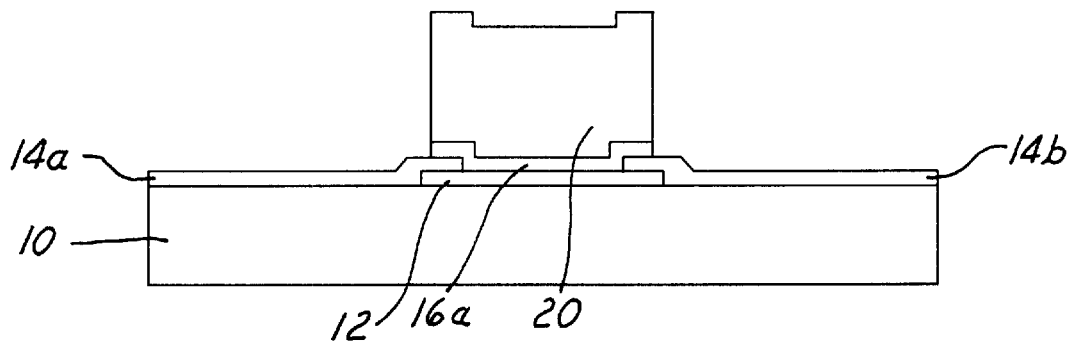

Referring now to FIG. 2, there is shown a schematic cross-sectional diagram illustrating the results of further processing of the microelectronic fabrication whose schematic cross-sectional diagram is illustrated in FIG. 1 to provide therefrom a microelectronic fabrication in accord with the first preferred embodiment of the present invention.

Shown in FIG. 2 is a schematic cross-sectional diagram of a microelectronic fabrication otherwise equivalent to the microelectronic fabrication whose schematic cross-sectional diagram is illustrated in FIG. 1, but wherein: (1) there has been formed within the aperture defined by the pair of patterned photoresist layers 18a and 18b a patterned terminal electrode layer 20; (2) the pair of patterned photoresist layers 18a and 18b has then been stripped from the microelectronic fabrication; and (3) the blanket barrier layer 16 (having formed thereupon the blanket seed layer not otherwise illustrated) has been patterned to form a patterned barrier layer 16a (having formed thereupon a patterned seed layer not otherwise illustrated).

Within the first preferred embodiment of the present invention, the patterned terminal electrode layer 20 is preferably formed employing a plating method, although methods other than plating methods may also be employed for forming within the context of the first preferred embodiment of the present invention a patterned terminal electrode layer which is functionally equivalent to the patterned terminal electrode layer 20.

Within the first preferred embodiment of the present invention, the patterned terminal electrode layer 20 overlaps each of the patterned dielectric passivation layers 14a and 14b by about 5 to about 11 microns. Similarly, within the first preferred embodiment of the present invention the patterned terminal electrode layer 20 is formed of a gold or a gold alloy terminal electrode material, although other terminal electrode materials, including but not limited to nickel, nickel alloy, other precious metal and other precious metal alloy terminal electrode materials may also be employed when forming the patterned terminal electrode layer 20. Typically and preferably the patterned terminal electrode layer 20 is formed to a thickness of from about 17 to about 28 microns, and more preferably from about 22 to about 23 microns, while preferably employing the plating method.

When employing the preferred plating method for forming the patterned terminal electrode layer 20 when formed of a gold terminal electrode material, the plating method also employs, in conjunction with an aqueous ionic gold source material: (1) a thallium concentration of from about 20 to about 80 parts per million (ppm); (2) a pH of from about 9.2 to about 9.8; (3) a plating temperature of from about 47 to about 53 degrees centigrade; (4) a plating current density of from about 3 to about 4 amps per square foot.

With respect to stripping from the microelectronic fabrication whose schematic cross-sectional diagram is illustrated in FIG. 1 the pair of patterned photoresist layers 18a and 18b to provide in part the microelectronic fabrication whose schematic cross-sectional diagram is illustrated in FIG. 2, the pair of patterned photoresist layers 18a and 18b may be stripped from the microelectronic fabrication whose schematic cross-sectional diagram is illustrated in FIG. 1 to provide in part the microelectronic fabrication whose schematic cross-sectional diagram is illustrated in FIG. 2 while employing photoresist stripping methods as are conventional in the art of microelectronic fabrication. Such photoresist stripping methods may be selected from the group including but not limited to wet chemical photoresist stripping methods, dry plasma photoresist stripping methods and combinations of wet chemical photoresist stripping methods and dry plasma photoresist stripping methods.

Finally, with respect to forming from the blanket barrier layer 16 (and the blanket seed layer formed thereupon) the corresponding patterned barrier layer 16a (and the corresponding patterned seed layer formed thereupon) such patterning may be accomplished employing wet chemical etch methods or dry plasma etch methods as are otherwise generally conventional in the art of microelectronic fabrication, although with either wet chemical etch methods or dry plasma etch methods there will be generally be lost a minimal and negligible thickness of the patterned terminal electrode layer 20 when formed of a gold or gold alloy terminal conductor material when etching the blanket seed layer when also formed of a gold or gold alloy seed material.

Within the first preferred embodiment of the present invention, when the blanket seed layer is formed of a gold or gold alloy seed material, the blanket seed layer is typically and preferably etched to form the patterned seed layer while employing an aqueous potassium iodide etchant at a concentration of about 1.5 pounds potassium iodide per gallon of deionized water and at room temperature. Similarly, within the preferred embodiments of the present invention when the blanket barrier layer 16 is formed of the titanium-tungsten alloy/titanium-tungsten alloy nitride/titanium-tungsten alloy laminate, the blanket barrier layer is preferably etched to form the patterned barrier layer 16a while employing an aqueous 30 percent hydrogen peroxide etchant at a temperature of about 70 degrees centigrade.

Although not specifically illustrated within the schematic cross-sectional diagram of FIG. 2, the microelectronic fabrication whose schematic cross-sectional diagram is illustrated within FIG. 2 is typically and preferably thermally annealed in order to provide optimal metallurgic properties, and in particular hardness, to at least the patterned terminal electrode layer 20. Such thermal annealing is typically and preferably undertaken within a nitrogen atmosphere, at a flow rate of from about 6 to about 9 cubic feet per minute (cfm) and a temperature of from about 295 to about 305 degrees centigrade for a time period of from about 10 to about 20 minutes, to provide the patterned terminal electrode layer 20, when formed of an electroplated gold terminal electrode material, of a hardness from about 35 to about 65 Vickers at 10 grams force.

Upon forming the microelectronic fabrication whose schematic cross-sectional diagram is illustrated in FIG. 2, there is formed a microelectronic fabrication having formed therein a terminal electrode structure which provides for enhanced barrier properties within the microelectronic fabrication within which is formed the terminal electrode structure. The terminal electrode structure of the present invention realizes the foregoing object by employing within the terminal electrode structure: (1) a first titanium-tungsten alloy layer, having formed thereupon; (2) a titanium-tungsten alloy nitride layer, in turn having formed thereupon; (3) a second titanium-tungsten alloy layer.

Figure 3:
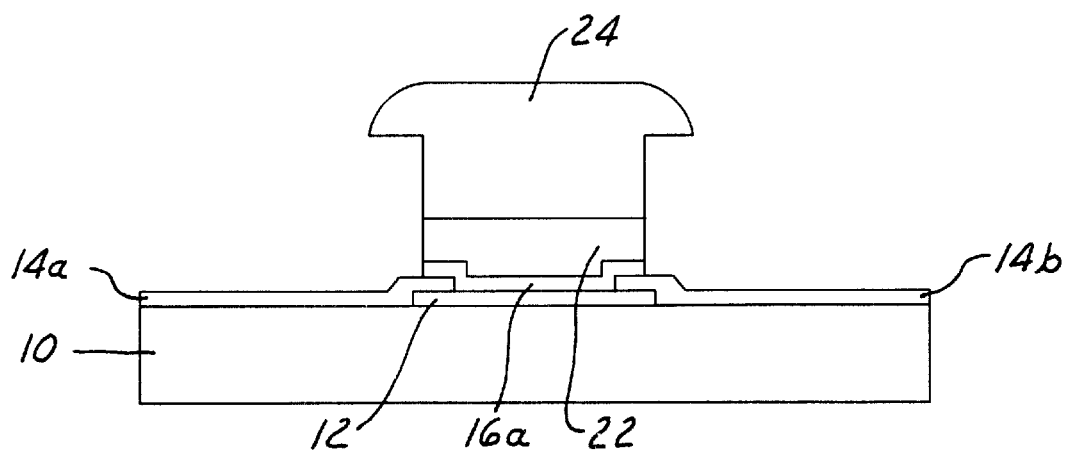

Referring now to FIG. 3, there is shown a schematic cross-sectional diagram of an alternate microelectronic fabrication which results from further processing of the microelectronic fabrication whose schematic cross-sectional diagram is illustrated in FIG. 1, where the alternate microelectronic fabrication comprises a microelectronic fabrication in accord with a second preferred embodiment of the present invention.

Shown in FIG. 3 is a schematic cross-sectional diagram of a microelectronic fabrication otherwise equivalent to the microelectronic fabrication whose schematic cross-sectional diagram is illustrated in FIG. 1, but wherein: (1) there has been formed within the aperture defined by the pair of patterned first photoresist layers 18a and 18b a patterned terminal electrode layer 22; (2) there has been formed upon the patterned terminal electrode layer 22 and bridging over the pair of patterned photoresist layers 18a and 18b in a mushroom shape a patterned solder layer 24; (3) the pair of patterned photoresist layers 18a and 18b has then been stripped from the microelectronic fabrication; and (4) the blanket barrier layer 16 (having formed thereupon the blanket seed layer not otherwise illustrated) has been patterned to form the patterned barrier layer 16a (having formed thereupon a patterned seed layer not otherwise illustrated).

Within the second preferred embodiment of the present invention, the patterned terminal electrode layer 22 is, similarly with the patterned terminal electrode layer 20 employed within the first preferred embodiment of the present invention, preferably formed employing a plating method, although methods other than plating methods may also be employed for forming within the context of the present invention a patterned terminal electrode layer which is functionally equivalent to the patterned terminal electrode layer 22.

Similarly with the patterned terminal electrode layer 20 within the first preferred embodiment of the present invention as illustrated within the schematic cross-sectional diagram of FIG. 2, the patterned terminal electrode layer 22 within the second preferred embodiment of the present invention overlaps each of the patterned dielectric passivation layers 14a and 14b by about 5 to about 11 microns. In contrast with the patterned terminal electrode layer 20 as employed within the first preferred embodiment of the present invention, within the second preferred embodiment of the present invention the patterned terminal electrode layer 22 is formed of a copper or a copper alloy terminal electrode material in order to assure wettability of the patterned solder layer formed thereupon, although other terminal electrode materials, including but not limited to nickel, nickel alloy, other precious metal and other precious metal alloy terminal electrode materials may also be employed when forming the patterned first terminal electrode layer 22. Typically and preferably the patterned terminal electrode layer 22 is formed to a thickness of from about 8 to about 16 microns, while preferably employing the plating method.

When employing the preferred plating method for forming the patterned terminal electrode layer 22 when formed of a copper terminal electrode material, the plating method also employs: (1) a copper II sulfate aqueous concentration of from about 9.0 to about 11.0 ounces per gallon; (2) a comparatively low pH; (3) a plating temperature of about room temperature; and (4) a plating current density of from about 20 to about 30 amps per square foot.

With respect to the patterned solder layer 24, the patterned solder layer 24 is preferably formed of a lead-tin solder material as is generally conventional in the art of microelectronic fabrication, and also preferably formed employing a plating method, although other methods may be employed. Typically and preferably, the lead-tin alloy solder material has a lead:tin weight ratio of from about 37:63 to about 95:5.

When employing the preferred plating method for forming the patterned solder layer 24 when formed of a lead-tin alloy solder material, the plating method also employs: (1) a lead II fluoroborate aqueous concentration of from about 3.2 to about 4.9 ounces per gallon and a tin II fluoroborate aqueous concentration of from about 6.5 to about 8.0 ounces per gallon; (2) a comparatively low pH; (3) a plating temperature of about room temperature; and (4) a plating current density of from about 20 to about 30 amps per square foot.

With respect to stripping from the microelectronic fabrication whose schematic cross-sectional diagram is illustrated in FIG. 1 the pair of patterned photoresist layers 18a and 18b to provide in part the microelectronic fabrication whose schematic cross-sectional diagram is illustrated in FIG. 3, the pair of patterned photoresist layers 18a and 18b may be stripped from the microelectronic fabrication whose schematic cross-sectional diagram is illustrated in FIG. 1 to provide in part the microelectronic fabrication whose schematic cross-sectional diagram is illustrated in FIG. 3 while employing photoresist stripping methods analogous or equivalent to the photoresist stripping as are employed for forming in part from the microelectronic fabrication whose schematic cross-sectional diagram is illustrated in FIG. 1 the microelectronic fabrication whose schematic cross-sectional diagram is illustrated in FIG. 2.

Finally, with respect to forming from the blanket barrier layer 16 (and the blanket seed layer formed thereupon) the corresponding patterned barrier layer 16a (and the corresponding patterned seed layer formed thereupon) such patterning may be accomplished employing wet chemical etch methods or dry plasma etch methods as are otherwise generally conventional in the art of microelectronic fabrication, although with wet chemical etch methods there will be generally be lost a minimal and negligible thickness of the patterned terminal electrode layer 22 when formed of a copper or copper alloy conductor material when etching the blanket seed layer when also formed in part of a copper or copper alloy seed material.

Within the second preferred embodiment of the present invention, the blanket seed layer when formed of a titanium material having formed thereupon a copper or copper alloy seed material is typically and preferably etched to form the patterned seed layer while employing: (1) an ethylene glycol and hydrofluoric acid aqueous etchant, in a ratio of about 13.5 liters ethylene glycol:2.4 liters hydroflluoric acid:4 gallons deionized water, for etching the titanium material; and (2) a proprietary acidic etchant for etching the copper or copper alloy seed material. Similarly, within the second preferred embodiment of the present invention, the blanket barrier layer 16 when formed of the titanium-tungsten alloy/titanium-tungsten alloy nitride/titanium-tungsten alloy laminate is preferably etched to form the patterned barrier layer 16a while employing a 30 percent aqueous hydrogen peroxide solution at a temperature of about 70 degrees centigrade.

Figure 4:
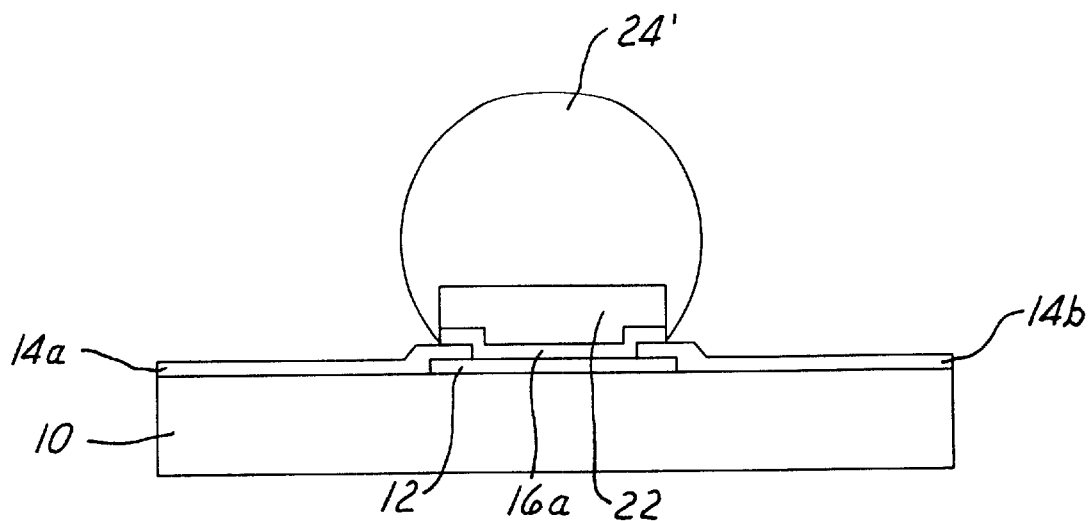

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the patterned solder layer 24 has been reflowed to form a reflowed patterned solder layer 24'.

When forming from the patterned solder layer 24 as illustrated within the schematic cross-sectional diagram of FIG. 3, the reflowed patterned solder layer 24' as illustrated within the schematic cross-sectional diagram of FIG. 4, there is typically and preferably employed an ambient environment or a nitrogen environment (in particular for higher melting temperature alloys) and: (1) a temperature of from about 220 to about 240 degrees centigrade for a time period of from about 1.5 to about 2.0 minutes for reflowing a lead:tin 37:63 alloy material; or (2) a temperature of from about 328 to about 338 degrees centigrade for a time period of from about 0.8 to about 1.2 minutes for reflowing a lead:tin 95:5 alloy material.

Upon forming the microelectronic fabrication whose schematic cross-sectional diagram is illustrated in FIG. 4, there is formed a microelectronic fabrication having formed therein a terminal electrode structure which provides for enhanced barrier properties within the microelectronic fabrication within which is formed the terminal electrode structure. The terminal electrode structure of the present invention realizes the foregoing object by employing within the terminal electrode structure: (1) a first titanium-tungsten alloy layer, having formed thereupon; (2) a titanium-tungsten alloy nitride layer, in turn having formed thereupon; (3) a second titanium-tungsten alloy layer.

As is understood by a person skilled in the art, the preferred embodiments of the present invention are illustrative of the present invention rather than limiting of the present invention. Revisions and modifications may be made to methods, structures and dimensions through which may be provided within a microelectronic fabrication a terminal electrode structure in accord with the preferred embodiments of the present invention, while still providing a terminal electrode structure within a microelectronic fabrication in accord with the present invention, further in accord with the appended claims.

What is claimed is:

1. A method for fabricating a microelectronic fabrication comprising:
   providing a substrate;
   forming over the substrate a patterned bond pad layer;
   forming over the patterned bond pad layer a barrier layer comprising:
      a first titanium-tungsten alloy layer;
      a titanium-tungsten alloy nitride layer formed upon the first titanium-tungsten layer; and
      a second titanium-tungsten alloy layer formed upon the titanium-tungsten alloy nitride layer; and
   forming upon the barrier layer a titanium layer.

2. The method of claim 1 wherein there is not formed interposed between the patterned bond pad layer and the barrier layer a silicide layer.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the patterned bond pad layer is formed from a bond pad material selected from the group consisting of aluminum, aluminum alloys, copper and copper alloys.

5. The method of claim 1 wherein:
   the first titanium-tungsten alloy layer has a first titanium:tungsten atomic ratio of from about 27:73 to about 33:67 and a first thickness of from about 450 to about 550 angstroms;
   the titanium-tungsten alloy nitride layer has a titanium:tungsten:nitrogen atomic ratio of from about 10:60:22 to about 12:62:25 and a thickness of from about 2700 to about 3300 angstroms; and
   the second titanium-tungsten alloy layer has a second titanium:tungsten atomic ratio of from about 27:73 to about 33:67 and a second thickness of from about 900 to about 1100 angstroms.

6. The method of claim 1 further comprising forming over the barrier layer a terminal electrode layer.

7. The method of claim 6 wherein the terminal electrode layer is formed of a terminal electrode material selected from the group consisting of gold, gold alloys, nickel, nickel alloys, copper, copper alloys, other precious metals and other precious metal alloys.

8. The method of claim 1 further comprising forming over the substrate a patterned passivation layer prior to forming over the substrate the barrier layer, where the patterned passivation layer passivates a series of edges of the patterned bond pad layer but does not cover a central portion of the patterned bond pad layer.

9. The method of claim 8 wherein the patterned passivation layer is formed from a passivation dielectric material selected from the group consisting of silicon oxide dielectric materials, silicon nitride dielectric materials, silicon oxynitride dielectric materials, laminates thereof and composites thereof.

10. The method of claim 1 wherein the titanium layer is formed to a thickness of from about 900 to about 1100 angstroms.

11. The method of claim 1 further comprising forming a copper layer upon the titanium layer.

12. The method of claim 11 wherein the copper layer is formed to a thickness of from about 3600 to about 4400 angstroms.

* * * * *